United States Patent
Twynam et al.

(12) 
(10) Patent No.: US 6,611,008 B2
(45) Date of Patent: *Aug. 26, 2003

(54) HETEROJUNCTION BIPOLAR TRANSISTOR CAPABLE OF RESTRAINING THE CONDUCTIVITY MODULATION OF THE BALLAST LAYER

(75) Inventors: John Kevin Twynam, Tenri (JP); Yoshiteru Ishimaru, Tenri (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/522,825

(22) Filed: Mar. 10, 2000

(65) Prior Publication Data
US 2002/0088993 A1 Jul. 11, 2002

(30) Foreign Application Priority Data
Mar. 12, 1999 (JP) .......................... 11-066359

(51) Int. Cl.⁷ .................. H01L 31/0328; H01L 21/8249
(52) U.S. Cl. ................ 257/197; 257/198; 257/201; 438/235; 438/309; 438/312
(58) Field of Search .................. 257/197, 198, 257/201, 565, 578, 582, 615; 438/235, 309, 312

(56) References Cited

U.S. PATENT DOCUMENTS

| | | | |
|---|---|---|---|
| 5,767,540 A | * | 6/1998 | Shimizu ........................ 257/197 |
| 6,043,520 A | * | 3/2000 | Yamamoto et al. .......... 257/198 |
| 6,147,371 A | * | 11/2000 | Tanaka .......................... 257/197 |

FOREIGN PATENT DOCUMENTS

| | | |
|---|---|---|
| EP | 0562272 A2 | 2/1993 |
| JP | 346334 A | 2/1991 |
| JP | 6349847 A | 12/1994 |
| JP | 77013 A | 1/1995 |

OTHER PUBLICATIONS

N. Yoshida et al., "InGap/GaAs HBT IC for 10Gb/s Optical Communication Systems", 1997, pp. 120–121.

* cited by examiner

*Primary Examiner*—Tom Thomas
*Assistant Examiner*—Donghee Kang
(74) *Attorney, Agent, or Firm*—Birch, Stewart, Kolasch & Birch, LLP

(57) ABSTRACT

A heterojunction bipolar transistor has a stack comprised of a base layer, an emitter layer and a ballast layer made of AlGaAs. The emitter layer is comprised of a single layer or a multiplicity of layers, and at least one of which is comprised of a material that prevents hole injection from the base layer into the ballast layer. Thus, the hole injection from the base layer into the emitter layer is prevented. Accordingly, it is able to prevent the conductivity modulation of the ballast layer that is the cause of a deterioration in temperature characteristics.

8 Claims, 12 Drawing Sheets

$\Delta E v_1 = (\mathcal{X}_2 + E g_2) - (\mathcal{X}_1 + E g_1)$ $\Delta E v_2 = (\mathcal{X}_2 + E g_2) - (\mathcal{X}_3 + E g_3)$

2

HETEROJUNCTION BIPOLAR TRANSISTOR CAPABLE OF RESTRAINING THE CONDUCTIVITY MODULATION OF THE BALLAST LAYER

BACKGROUND OF THE INVENTION

The present invention relates to a heterojunction bipolar transistor that is a semiconductor device of a III–V compound, a semiconductor device employing the same and a heterojunction bipolar transistor fabricating method.

Conventionally, as an AlGaAs/GaAs heterojunction bipolar transistor (HBT), there has been a structure as shown in FIG. 8. In FIG. 8, there are shown an Au/Ge/Ni emitter ohmic electrode 1, an n$^+$-type GaAs cap layer 2 (100 nm in thickness, donor concentration n=5×10$^{18}$ cm$^{-3}$ (n representing the donor concentration hereinafter)) and an n-type Al$_{1-y}$Ga$_y$As crystal mixture ratio graded cap layer 3 (20 nm in thickness, n=5×10$^{17}$ cm$^{-3}$, y=0.35→0.0 (y=0.35 on the substrate side and y=0 on the surface side)). There are also shown an n-type Al$_{0.35}$Ga$_{0.65}$As ballast layer 4 (200 nm in thickness, n=5×10$^{16}$ cm$^{-3}$), an n-type Al$_{0.3}$Ga$_{0.7}$As emitter layer 5 (10 nm in thickness, n=5×10$^{17}$ cm$^{-3}$), a p$^+$-type GaAs base layer 6 (80 nm in thickness, acceptor concentration p=2×10$^{19}$ cm$^{-3}$ (p representing the acceptor concentration hereinafter)) and a Ti/Pt/Au base ohmic electrode 7. There are further shown an n-type GaAs collector layer (700 nm in thickness, n=2×10$^{16}$ cm$^{-3}$), an n$^+$-type GaAs sub-collector layer 9 (500 nm in thickness, n=5×10$^{18}$ cm$^{-3}$), an Au/Ge/Ni collector ohmic electrode 10 and a semi-insulating GaAs substrate 11.

In connection with the AlGaAs/GaAs HBT having the aforementioned construction, it is well known that integrating the ballast layer having a crystal mixture ratio x of 0.15≦x≦0.4 increases the temperature coefficient of the ballast resistance and is effective for the uniformity of current and the stability of temperature through the restraint of thermal runaway within a wide range of temperature when the crystal mixture ratio x is adjusted(prior art reference of Japanese Patent Laid-Open Publication No. HEI 6-349847). The HBT having an AlGaAs ballast layer as described above has an emitter layer made of only AlGaAs that has a doping concentration and an Al crystal mixture ratio different from those of the ballast layer.

However, the aforementioned conventional AlGaAs/GaAs HBT has had the following problems. That is, during operation at a high temperature and a high current, the AlGaAs/GaAs HBT having the aforementioned AlGaAs ballast layer causes a serious problem that the resistance of the ballast layer is disadvantageously reduced due to a high junction temperature.

The reduction in ballast resistance due to the increase in junction temperature often reduces the effect of the ballast resistance as follows. In detail, FIG. 9 shows a graph of collector current density Jc to base-to-emitter voltage Vbe characteristics (Jc-Vbe characteristics). According to these Jc-Vbe characteristics, the junction temperature increases much when a collector-to-emitter voltage Vce is high, and this causes a curve of a negative slope. This fact indicates the instability of the aforementioned HBT and causes a non-uniformity in terms of current. The above-mentioned negative slope is ascribed to a modulation of conductivity (reduction in resistance) of the ballast resistance layer due to hole injection.

FIG. 10 schematically shows the band structure of the aforementioned HBT. The band offset energy ΔEv of the valence band between AlGaAs and GaAs is about 36% of a difference ΔEg between their band gap energies, and the remaining 64% is the band offset energy ΔEc of the conduction band between them. As it is shown in FIG. 11, the band offset energy ΔEv is defined as an energy barrier in the valence band generated at the interface of two different semiconductor materials. When one material has electron affinity $\chi_1$ and band gap energy Eg$_1$ and the other material has electron affinity $\chi_2$ and band gap energy Eg$_2$, the energy barrier ΔEv is expressed by:

$$\Delta Ev = (\chi_2 + Eg_2) - (\chi_1 + Eg_1).$$

The band offset energy ΔEv(x) with respect to AlGaAs can be expressed by ΔEv(x)=0.449x(eV) (0<x<0.45). Therefore, the band offset energy ΔEv in the valence band with respect to typical AlGaAs/GaAs of a crystal mixture ratio x=0.3 becomes about 135 meV (=0.449×0.3×10$^3$ meV). As a result, hole injection from the base layer to the emitter layer occurs, as a consequence of which the current gain h$_{FE}$ of the AlGaAs/GaAs HBT is significantly reduced at high temperature. The temperature dependency of hole injection at a constant collector current is given by Jp~exp(−ΔEv/kT). In this case, Jp represents the Hall current density, k represents the Boltzmann's constant and T represents the absolute temperature. Each hole injected from the base layer into the emitter layer diffuses toward the ballast layer, and the movement of electrons from the GaAs cap layer to the ballast layer occurs in order to satisfy space charge neutralization condition. Under the conditions of high current and high temperature, the hole density of the ballast layer is equivalent to the dope concentration of the ballast layer. As a result, the aforementioned electron movement causes a reduction in the resistance of the ballast layer. FIG. 10 schematically shows this phenomenon.

The hole density in the ballast layer at high current and high temperature can be calculated from the aforementioned temperature dependency of the current gain h$_{FE}$ of the HBT and the mobility of an electron and a hole as follows:

$$p \approx N_D \mu_e / (h_{FE}(T) \mu_h)$$

where p represents the hole density in the ballast layer, N$_D$ represents the doping concentration of the donor in the ballast layer, h$_{FE}$(T) represents the temperature-dependent current gain, and $\mu_e$ and $\mu_h$ are the mobility of an electron and a hole respectively. According to the above expression, assuming that the doping concentration N$_D$ of the donor in the ballast layer is N$_D$=5×10$^{16}$cm$^{-3}$ and the current gain h$_{FE}$ is h$_{FE}$=30, then the hole density to be injected into the ballast layer is 2.2×10$^{16}$ cm$^{-3}$ in the typical AlGaAs/GaAs HBT where the electron mobility and hole mobility are 4000 cm$^2$/Vsec and 300 cm$^2$/Vsec, respectively. This hole density is comparable to the doping concentration N$_D$, and this indicates that a considerable degree of conductivity modulation (reduction in resistance) of the ballast layer occurs. This conductivity modulation exhibits a similar characteristic on an AlGaAs ballast layer having a crystal mixture ratio x in the range of 0.15≦x≦0.4 but also an AlGaAs ballast layer in the range of 0≦x≦0.45. For a given ballast resistance, the smaller the crystal mixture ratio x becomes, the greater the electron mobility becomes, so that the donor concentration in the ballast layer becomes low. Therefore, the hole injection becomes a more serious problem. In contrast to this, the ballast layer generally comes to have a high density when the crystal mixture ratio x exceeds 0.45, and the hole injection comes to exert scarce influence. However, the ballast layer originally has a poor performance when the crystal mixture ratio x is not smaller than 0.45.

SUMMARY OF THE INVENTION

Accordingly, an object of the present invention is to provide an HBT capable of restraining the conductivity modulation of the ballast layer that is the cause of a deterioration in temperature characteristics by preventing hole injection from the base layer into the emitter layer.

In order to achieve the above-mentioned object, the present invention provides a heterojunction bipolar transistor having a stack comprised of a base layer, an emitter layer and a ballast layer made of AlGaAs, wherein the emitter layer is comprised of a single layer or a multiplicity of layers, and at least one of which is comprised of a material that prevents hole injection from the base layer into the ballast layer.

According to the construction of the present invention, the hole injection from the base layer into the ballast layer is prevented by the emitter layer, and therefore, the reduction in resistance of the AlGaAs ballast layer is prevented. Therefore, uniformity of current and temperature can be obtained even at a high temperature and a high current density without hindering the effective ballast effect by virtue of the resistance of the high temperature coefficient of the AlGaAs ballast layer.

The present invention also provides a heterojunction bipolar transistor having a stack comprised of a base layer, an emitter layer and a ballast layer made of AlGaAs, wherein the emitter layer is comprised of a single layer or a multiplicity of layers, at least one layer of which has a value $\Delta Ev/\Delta Eg$, which is a ratio of the valence band offset energy $\Delta Ev$ between the one layer and the base layer to the band gap energy difference $\Delta Eg$ between the one layer and the base layer, being greater than 0.36.

According to the construction of the present invention, the energy barrier between said one layer of the emitter layer and the base layer becomes greater than the energy barrier between the conventional AlGaAs emitter layer and the GaAs base. Thus, the hole injection from the base layer into the ballast layer is prevented by the emitter layer, and therefore, the reduction in resistance of the AlGaAs ballast layer is prevented. Therefore, uniformity of current and temperature can be obtained even at a high temperature and a high current density without hindering the effective ballast effect by virtue of the resistance of the high temperature coefficient of the AlGaAs ballast layer.

The present invention also provides a heterojunction bipolar transistor having a stack comprised of a base layer, an emitter layer and a ballast layer made of AlGaAs, wherein the emitter layer is comprised of a single layer or a multiplicity of layers, at least one layer of which has a valence band offset energy $\Delta Ev$ between the one layer and the base layer being greater than 135 meV.

According to the construction of the present invention, similarly to the aforementioned construction, the energy barrier between said one layer of the emitter layer and the base layer becomes greater than the energy barrier between the conventional AlGaAs emitter layer and the GaAs base. Thus, the hole injection from the base layer into the ballast layer is prevented by the emitter layer, and therefore, the reduction in resistance of the AlGaAs ballast layer is prevented. Therefore, uniformity of current and temperature can be obtained even at a high temperature and a high current density without hindering the effective ballast effect by virtue of the resistance of the high temperature coefficient of the AlGaAs ballast layer.

In one embodiment, said one layer of the emitter layer is made of at least one of InGaP, InAlP, InGaAlP, InAlAsP or InGaAlAsP.

According to the construction of this one embodiment, if the base layer is made of a GaAs layer, the value $\Delta Ev/\Delta Eg$, which is the ratio of the valence band offset energy $\Delta Ev$ between said one layer and the base layer to the band gap energy difference $\Delta Eg$ between said one layer and the base layer, becomes greater than 0.36. In addition to this, the valence band offset energy $\Delta Ev$ between said one layer and the base layer becomes greater than the value of 135 meV. Therefore, uniformity of current and temperature can be obtained even at a high temperature and a high current density without hindering the effective ballast effect by virtue of the resistance of the high temperature coefficient of the AlGaAs ballast layer.

In one embodiment, the emitter layer is comprised of a one layer made of InGaP, InAlP, InGaAlP, InAlAsP or InGaAlAsP.

According to the construction of this one embodiment, the whole body of the emitter layer can be operated as a barrier layer against holes that tend to move from the base layer into the ballast layer. Therefore, uniformity of current and temperature can be obtained even at a high temperature and a high current density without hindering the effective ballast effect by virtue of the resistance of the high temperature coefficient of the AlGaAs ballast layer.

In one embodiment, the ballast layer is comprised of an n-type semiconductor having a donor concentration lower than that of the emitter layer, and at least part of the ballast layer is an $Al_xGa_{1-x}As$ layer having an Al crystal mixture ratio x in a range of $0<x\leq0.45$.

According to the construction of this one embodiment, by comparison with the ballast layer constructed of GaAs, the space charge modulation by the electrons which move from the emitter layer to the ballast layer scarcely occurs, because the ballast layer made of AlGaAs having a smaller electron affinity. Therefore, the resistance value of the ballast resistance layer does not change even at a high temperature and a high current density, allowing uniformity of current and temperature to be obtained.

In one embodiment, at least part of the ballast layer is an $Al_xGa_{1-x}As$ layer having an Al crystal mixture ratio x in a range of $0.12<x\leq0.4$.

According to the construction of this one embodiment, the space charge modulation by the electrons which moves from the emitter layer to the ballast layer scarcely occurs because the crystal mixture ratio x is set so that $0.15\leq x$, and the temperature coefficient of the resistance value of the ballast layer is great because the crystal mixture ratio x is set so that $x\leq0.4$. By the combination of them, uniformity of current and temperature can be obtained in a wide range of high temperature.

The present invention also provides a heterojunction bipolar transistor having a stack comprised of a base layer, an emitter layer and a ballast layer, wherein the emitter layer is comprised of a multiplicity of layers, and one layer of the emitter layer that adjoins the base layer is made of InGaP, InAlP, InGaAlP, InAlAsP or InGaAlAsP.

According to the construction of the present invention, the one layer of the emitter layer that adjoins the base layer is made of InGaP, InAlP, InGaAlP, InAlAsP or InGaAlAsP. With this arrangement, the hole injection from the base layer into the ballast layer is reliably prevented by said one layer even at a high temperature and a high current density. Then, this provides a synergistic effect with the effective ballast effect by virtue of the resistance of the high temperature coefficient of the AlGaAs ballast layer. Therefore, reliability of the HBT is improved.

In one embodiment, the emitter layer has a two-layer structure comprised of an AlGaAs layer and an InGaP layer.

The present invention further provides a heterojunction bipolar transistor having a stack comprised of a base layer, an emitter layer and a ballast layer, wherein the emitter layer is comprised of a multiplicity of layers, and one layer of the emitter layer that adjoins the ballast layer is made of InGaP, InAlP, InGaAlP, InAlAsP or InGaAlAsP.

According to the construction of the present invention, the hole injection from the base layer into the ballast layer is prevented by said one layer of the emitter layer even at a high temperature and a high current density, and the base current is increased by the recombination of electron and hole in the emitter region up to the aforementioned one layer. As a result, a different type of ballast effect of reducing the collector current is generated, and this allows the obtainment of a further improved uniformity of current and temperature even at a high temperature and a high current density.

In one embodiment, the emitter layer has a two-layer structure comprised of an AlGaAs layer and an InGaP layer.

According to the construction of the present invention, the hole injection from the base layer into the ballast layer is prevented by the above InGaP layer of the emitter layer even at a high temperature and a high current density, and the base current is increased by the recombination of electron and hole in the AlGaAs layer of the emitter layer up to the aforementioned InGaP layer. As a result, a different type of ballast effect of reducing the collector current is generated, and this allows the obtainment of a further improved uniformity of current and temperature even at a high temperature and a high current density.

According to the aforementioned constructions, the injection and diffusion of holes from the base layer into the ballast layer can be sufficiently prevented even at a high temperature and a high current density. This can consequently obviate the need for increasing the thickness of the ballast layer and increasing the resistance taking into account the reduction in ballast resistance due to the hole injection at a high temperature and a high current density, and consequently allows the thickness and resistance of the ballast layer to be reduced. As a result, the step difference on the surface of the HBT device becomes small, so that the HBT device which has a low resistance and high performance can be prepared easily.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
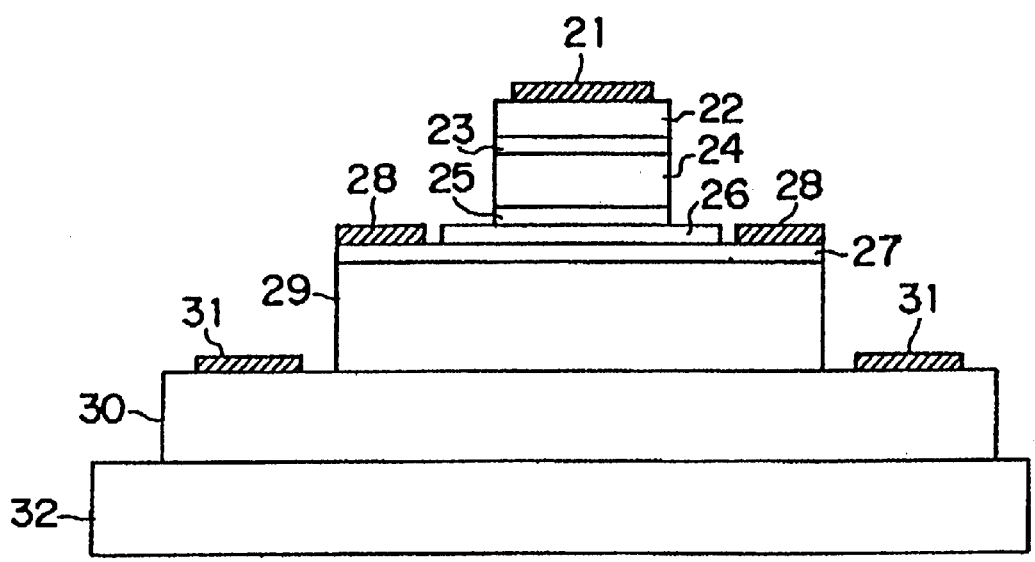
FIG. 1 is a schematic sectional view of an HBT according to the present invention.

The present invention will be described in detail below on the basis of the embodiments shown in the drawings.

(First Embodiment)

FIG. 1 is a schematic sectional view showing the structure of the HBT of the present embodiment. As shown in this figure, the HBT has a construction in which some semiconductor layers and metal electrode layers are stacked. There are shown an Au/Ge/Ni emitter ohmic electrode 21, an n$^+$-type GaAs cap layer 22 (100 nm in thickness, n=5×10$^{18}$ cm$^{-3}$) and an n-type Al$_x$Ga$_{1-x}$As crystal mixture ratio graded cap layer 23 (20 nm in thickness, n=5×10$^{17}$ cm$^{-3}$, x=0.35→0.0 (x=0.35 on the substrate side and x=0 on the surface side)). There are also shown an n-type Al$_{0.35}$Ga$_{0.65}$As ballast layer 24 (200 nm in thickness, n=5×10$^{16}$ cm$^{-3}$), an n-type Al$_{0.3}$Ga$_{0.7}$As emitter layer 25 (50 nm in thickness, n=5×10$^{17}$ cm$^{-3}$), an n-type InGaP emitter layer 26 (40 nm in thickness, n=5×10$^{17}$ cm$^{-3}$), a p$^+$-type GaAs base layer 27 (80 nm in thickness, p=2×10$^{19}$ cm$^{-3}$), a Ti/Pt/Au base ohmic electrode 28 and an n-type GaAs collector layer 29 (700 nm in thickness, n=2×10$^{16}$ cm$^{-3}$). There are further shown an n$^+$-type GaAs sub-collector layer 30 (500 nm in thickness, n=5×10$^{18}$ cm$^{-3}$), an Au/Ge/Ni collector ohmic electrode 31 and a semi-insulating GaAs substrate 32.

As described above, in the present embodiment, the n-type InGaP emitter layer 26 including P is formed between the n-type Al$_{0.3}$Ga$_{0.7}$As emitter layer 25 and the p$^+$-type GaAs base layer 27, forming an InGaP/GaAs heterojunction. With this arrangement, the energy barrier of the InGaP/GaAs heterojunction is increased, by which the hole injection from the base layer into the emitter layer can be sufficiently prevented even at a high temperature and a high current density. Therefore, the effect provided by the resistance of the high temperature coefficient of the AlGaAs ballast layer 24 can be increased.

The HBT having the aforementioned construction is formed as follows. First, the n$^+$-type GaAs sub-collector layer (Si doping) 30, the n-type GaAs collector layer (Si doping) 29, the p$^+$-type GaAs base layer (C doping) 27, the n-type InGaP emitter layer (Si doping) 26, the n-type Al$_{0.3}$Ga$_{0.7}$As emitter layer (Si doping) 25, the n-type Al$_{0.35}$Ga$_{0.65}$As ballast layer (Si doping) 24, the n-type Al$_x$Ga$_{1-x}$As crystal mixture ratio graded cap layer (x is changed gradually in the order of growth from an initial value x=0.35 to a final value x=0 on the surface side; Si doping) 23 and the n$^+$-type GaAs cap layer (Si doping) 22 are successively formed on the semi-insulating GaAs substrate 32 by the MOCVD (Metal-Organic Chemical Vapor Deposition) method.

Next, a resist mask for emitter mesa etching is formed by the normal photolithographic method on the semiconductor substrate obtained by forming the n$^+$f-type GaAs sub-collector layer 30 through the n$^+$-type GaAs cap layer 22 on the semi-insulating GaAs substrate 32. Then, the n$^+$-type GaAs cap layer 22, the n-type $Al_xGa_{1-x}As$ crystal mixture ratio graded cap layer 23, the n-type $Al_{0.35}Ga_{0.65}As$ ballast layer 24 and the n-type $Al_{0.3}Ga_{0.7}As$ emitter layer 25 are removed by etching using a phosphoric acid based etchant (a mixed liquor of $H_3PO_4$: $H_2O_2$: $H_2O$) with this mask, forming a tower-like structure. Next, the n-type InGaP emitter layer 26 is removed by etching using a hydrochloric acid based etchant for forming. In this case, by forming an edge-thinning structure in which the periphery of the n-type InGaP emitter layer 26 is left around the n-type $Al_{0.3}Ga_{0.7}As$ emitter layer 25, the reliability is improved. Accordingly, as shown in FIG. 1, it is preferable to leave the periphery of the n-type InGaP emitter layer 26 around the n-type $Al_{0.3}Ga_{0.7}As$ emitter layer 25. In this case, the n-type InGaP emitter layer 26 may be left widely to the position just below the position where the Ti/Pt/Au base ohmic electrode 28 is subsequently formed. After completing the mesa etching, the resist mask is removed.

Figure 3:
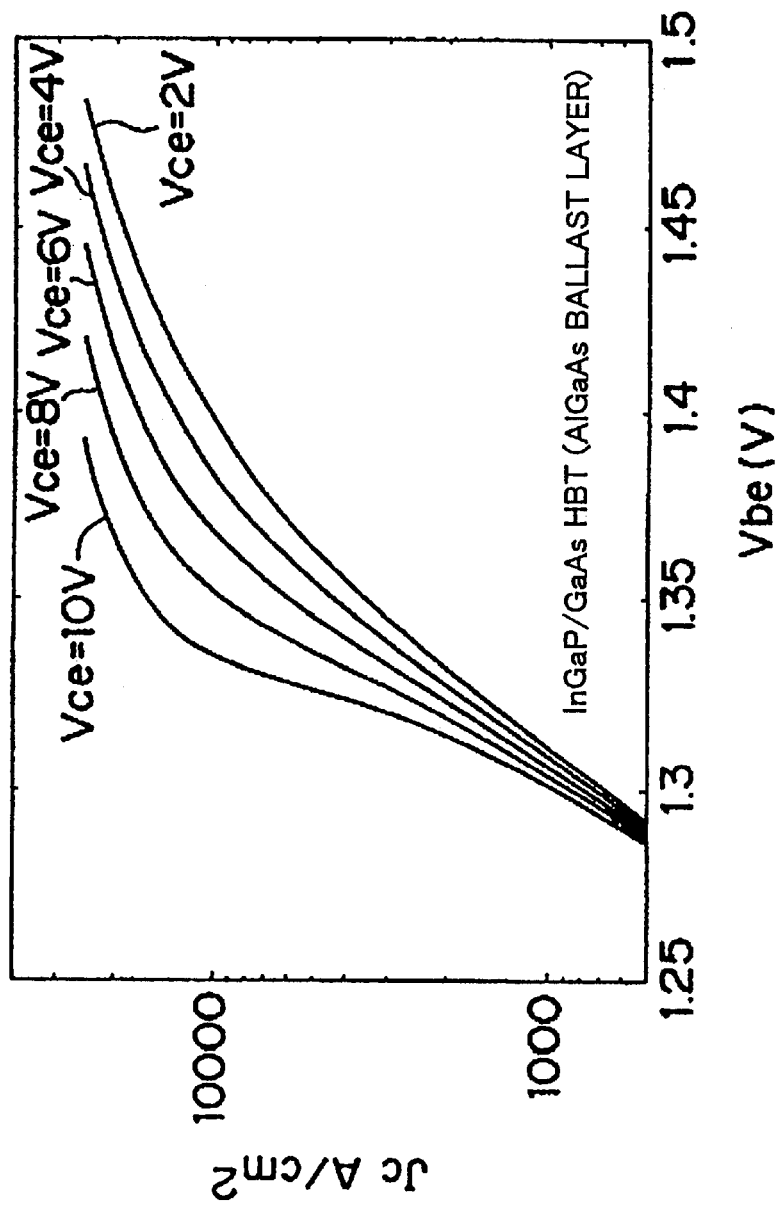
FIG. 3 is a graph showing the Jc-Vbe characteristics of the HBT shown in FIG. 1.

In the thus-formed HBT, the band offset energy ΔEv of the valence band of the InGaP/GaAs heterojunction was about 280 meV. This great energy barrier can sufficiently prevent the hole injection from the base layer into the emitter layer even at a high temperature and a high current density. That is, by using InGaP (or an appropriate material including P) for forming the emitter layer as in the present embodiment, the effect of the n-type AlGaAs ballast layer 24 can be sufficiently increased. FIG. 3 shows the Jc-Vbe characteristic curves of the HBT of the present embodiment. As shown in FIG. 3, the slope of the curve is still positive even at a voltage of Vce=10 V, and therefore a stable operation is provided.

Furthermore, the HBT of the present embodiment has another effect described as follows. In general, it is well known that using an n-type $Al_xGa_{1-x}As$ ballast layer having a crystal mixture ratio x within a range of $0.15 \leq x \leq 0.4$ obtains satisfactory uniformity of current and stability of temperature in the AlGaAs/GaAs HBT. However, if the conventional AlGaAs is used as an emitter material, then there is the drawback that the material has a poor long-term reliability. However, the HBT of the present embodiment, which employs InGaP as an emitter material, can obtain an excellent long-term reliability through an experimental accelerated operating life test.

Figure 4A:
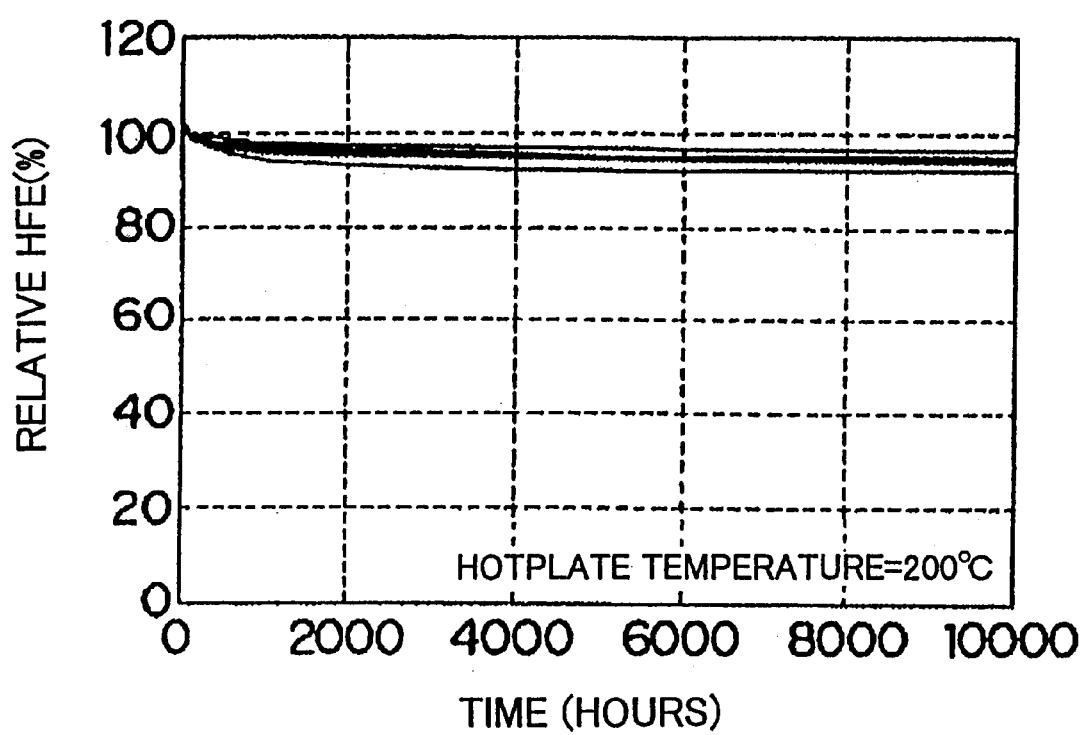
FIG. 4($a$) and FIG. 4($b$) are graphs of time-based change of the current gain $h_{FE}$ of the HBT shown in FIG. 1 and the conventional HBT respectively.

FIG. 4(a) is a graph of the time-based change of the current gains $h_{FE}$ of ten HBTs of the present embodiment. That is, the graph shows the results obtained under the condition that each AlGaAs/InGaP/GaAs HBT is placed on a hot plate having a temperature of 200° C. and that an electric current flows through each HBT at a collector current density Jc=25000 $A/cm^2$ and a collector-to-emitter voltage in Vce=2 V. As is understood from FIG. 4(a), the current gain $h_{FE}$ showed little variation even after a lapse of 10,000 hours. In this way, the combination of the AlGaAs ballast layer and the emitter layer that is not made of AlGaAs obtained a satisfactory total reliability in terms of good uniformity of temperature and current and long-term reliability.

Figure 4B:
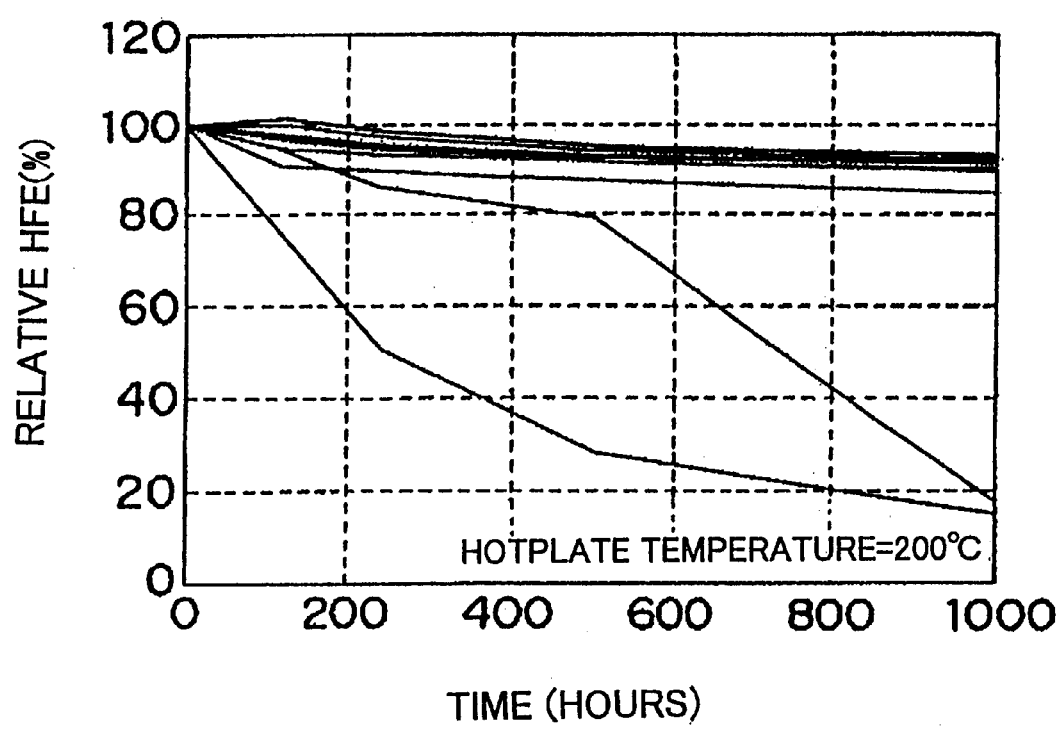

In contrast to this, as shown in FIG. 4(b), some of the conventional ten HBTs employing AlGaAs as an emitter material exhibited a sudden reduction of the current gain $h_{FE}$ after a lapse of 1,000 hours. This proves the effect of the present embodiment.

As described above, the present embodiment provides an HBT having the n-type $Al_xGa_{1-x}As$ ballast layer ($0 \leq x \leq 0.45$) 24 and the emitter layer having a dual structure that is made of the n-type AlGaAs emitter layer 25 and the n-type InGaP emitter layer 26. The InGaP/GaAs heterojunction is formed between the emitter layer and the $p^+$-type GaAs base layer 27. Therefore, the value ΔEv/ΔEg, which is the ratio of the band offset energy ΔEv in the valence band of the InGaP/GaAs heterojunction to the band gap energy difference ΔEg between the InGaP emitter layer and the GaAs base layer, becomes greater than 0.36 that is the value of the conventional AlGaAs/GaAs heterojunction. Furthermore, the band offset energy ΔEv in the valence band becomes 280 meV, which is sufficiently greater than 135 meV that is the value of the conventional AlGaAs/GaAs heterojunction. Therefore, the hole injection from the base layer into the emitter layer can be sufficiently prevented even at a high temperature and a high current density.

Figure 2:
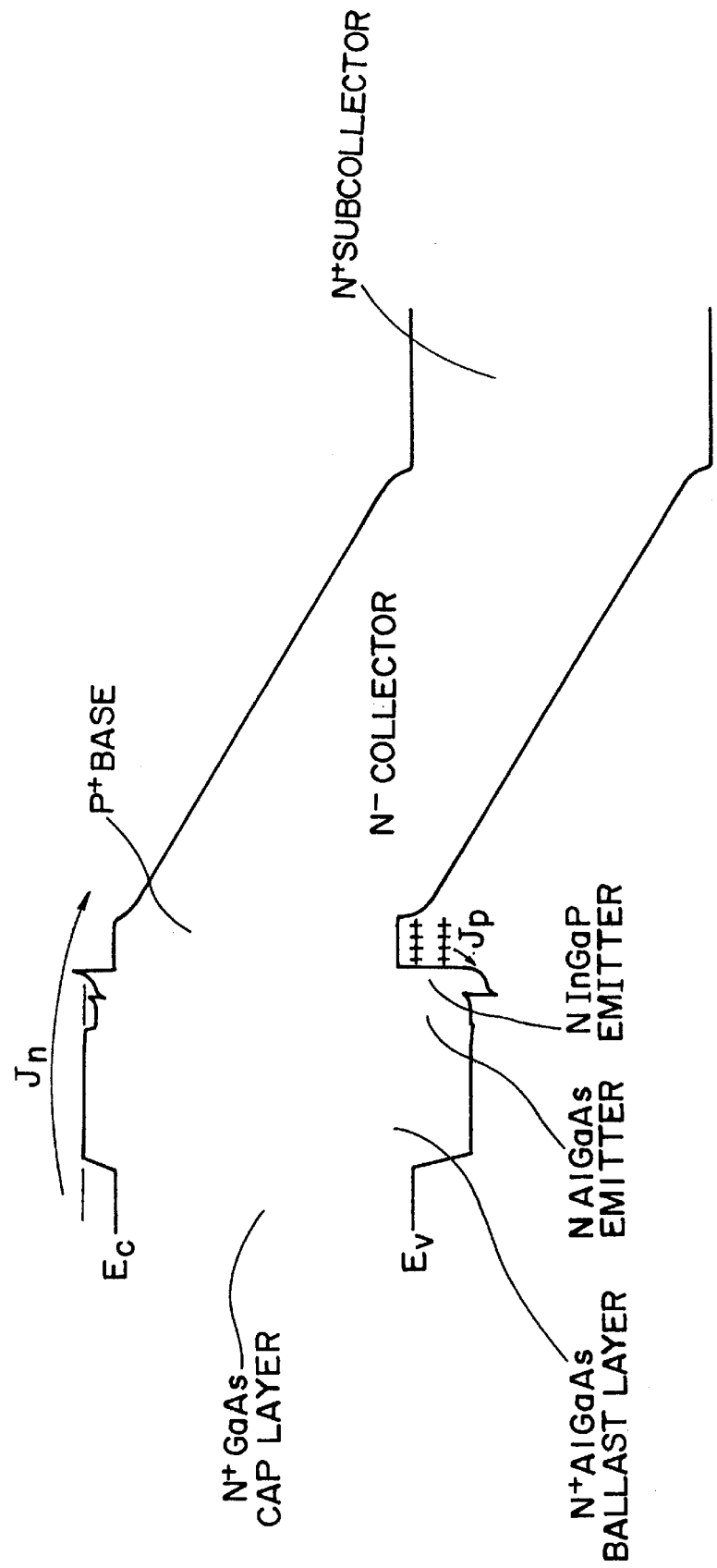
FIG. 2 is a schematic view showing the energy band diagram of the HBT shown in FIG. 1.

As shown in FIG. 2, the band offset energy ΔEv in the valence band between the n-type $Al_xGa_{1-x}As$ ballast layer 24 and the InGaP emitter layer 26 is positive when it is estimated in the direction of the former relative to the latter. Therefore, the holes in the base layer are prevented from diffusing into the ballast layer, as a consequence of which the InGaP emitter layer 26 operates as a sufficient barrier against the holes.

That is, according to the present embodiment, the effect of the n-type AlGaAs ballast layer 24 is not hindered even at a high temperature and a high current density, and sufficient uniformity of current and temperature can be obtained. Furthermore, by employing the n-type InGaP emitter layer 26 that is not made of n-type AlGaAs as the emitter layer, excellent long-term reliability can be obtained.

Furthermore, according to the present embodiment which is capable of sufficiently preventing the hole injection from the base layer into the ballast layer even at a high temperature and a high current density, the following effects can also be obtained. That is, as described above, the ballast layer 24 in the present embodiment is made of an n-type semiconductor having a donor concentration lower than that of the emitter layers 25 and 26. Then, the reduction in resistance of the ballast layer due to hole injection is significant in the case where the donor concentration is low. Therefore, it has conventionally been necessary to increase the donor concentration taking into account the reduction in ballast resistance due to hole injection in order to ensure operation at an elevated temperature. However, the resistance value is reduced as the donor concentration is increased, and therefore, the thickness of the ballast layer is required to be made thicker by that much. This has led to a difficulty in fabricating the device. On the contrary, according to the present embodiment, the hole injection into the ballast layer can be sufficiently prevented even at a high temperature and a high current density. Therefore, the donor concentration is not required to be increased even when the device is operated at an elevated temperature, and the thickness of the ballast layer can be reduced by that much.

(Second Embodiment)

Figure 5:
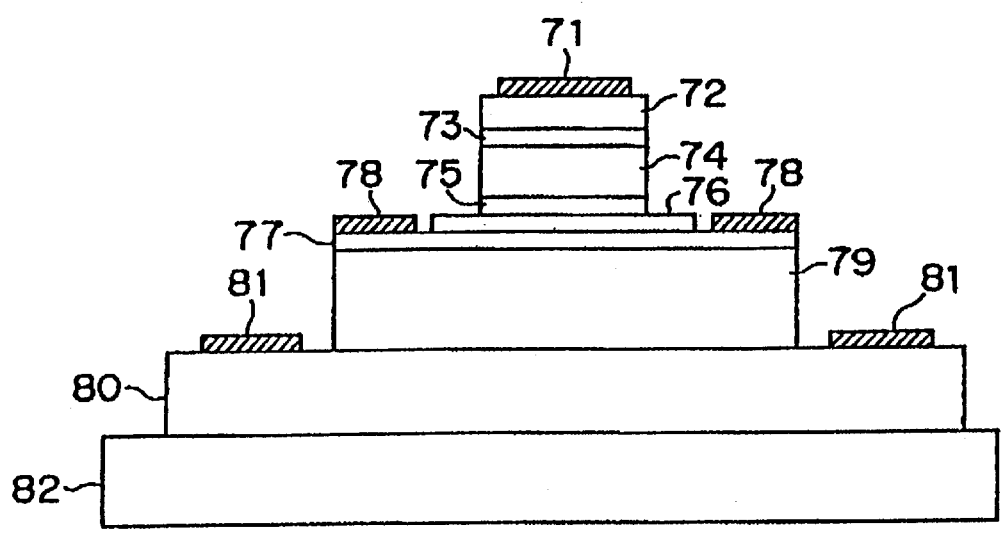
FIG. 5 is a schematic sectional view of another HBT different from that of FIG. 1.

FIG. 5 is a schematic sectional view showing the structure of the HBT of the present embodiment. The present embodiment has a construction generally identical to that of the first embodiment except that the emitter layer having the AlGaAs/InGaP structure of the first embodiment is replaced by an emitter layer having a stacked structure comprised of an InGaP layer and a crystal mixture ratio graded AlGaAs layer.

There are shown an Au/Ge/Ni emitter ohmic electrode 71, an $n^+$-type GaAs cap layer 72 (100 nm in thickness, n=5× $10^{18}$ $cm^{-3}$) and an n-type $Al_xGa_{1-x}As$ crystal mixture ratio graded cap layer 73 (20 nm in thickness, n=5×$10^{17}$ $cm^{-3}$, x=0.35→0.0 (x=0.35 on the substrate side and x=0 on the surface side)) There are also shown an n-type $Al_{0.35}Ga_{0.65}As$ ballast layer 74 (200 nm in thickness, n=5×10¹⁶ cm⁻³), an n-type InGaP emitter layer 75 (50 nm in thickness, n=5×10¹⁷ cm⁻³), and an n-type $Al_yGa_{1-y}As$ crystal mixture ratio graded emitter layer 76 (40 nm in thickness, n=5×10¹⁷ cm⁻³, y=0.0→0.25 (y=0 on the base side and y=0.25 on the surface side)). There are also shown a p⁺-type GaAs base layer 77 (80 nm in thickness, p=2×10¹⁹ cm⁻³), a Ti/Pt/Au base ohmic electrode 78 and an n-type GaAs collector layer 79 (700 nm in thickness, n=2×10¹⁶ cm⁻³) There are further shown an n⁺-type GaAs sub-collector layer 80 (500 nm in thickness, n=5×10¹⁸ cm⁻³), an Au/Ge/Ni collector ohmic electrode 81 and a semi-insulating GaAs substrate 82.

As described above, according to the present embodiment, the base On-state voltage is reduced by employing the n-type $Al_yGa_{1-y}As$ crystal mixture ratio graded emitter layer 76. Therefore, the barrier against the effective hole movement in the valence band between the base layer and the emitter layer can be raised in the operating state of the transistor. Further, by stacking the n-type InGaP emitter layer 75 on the n-type $Al_yGa_{1-y}As$ crystal mixture ratio graded emitter layer 76, the barrier against the hole movement in the valence band can be further raised. This can sufficiently prevent the hole injection from the p⁺-type GaAs base layer 77 into the n-type AlGaAs ballast layer 74 even at a high temperature and a high current density, enabling the prevention of a reduction in the resistance of the ballast layer 74. Then, at a high temperature, the holes of the p⁺-type GaAs base layer 77 move over the barrier between the base layer and the emitter layer and recombine with the electrons in the n-type AlGaAs crystal mixture ratio graded emitter layer 76, thereby increasing the base current. This consequently produces the another ballast effect (reduction in collector current due to the reduction in the current gain $h_{FE}$) by virtue of the resistance of the base layer 77 in addition to that of the ballast layer 74.

(Third Embodiment)

Figure 6:
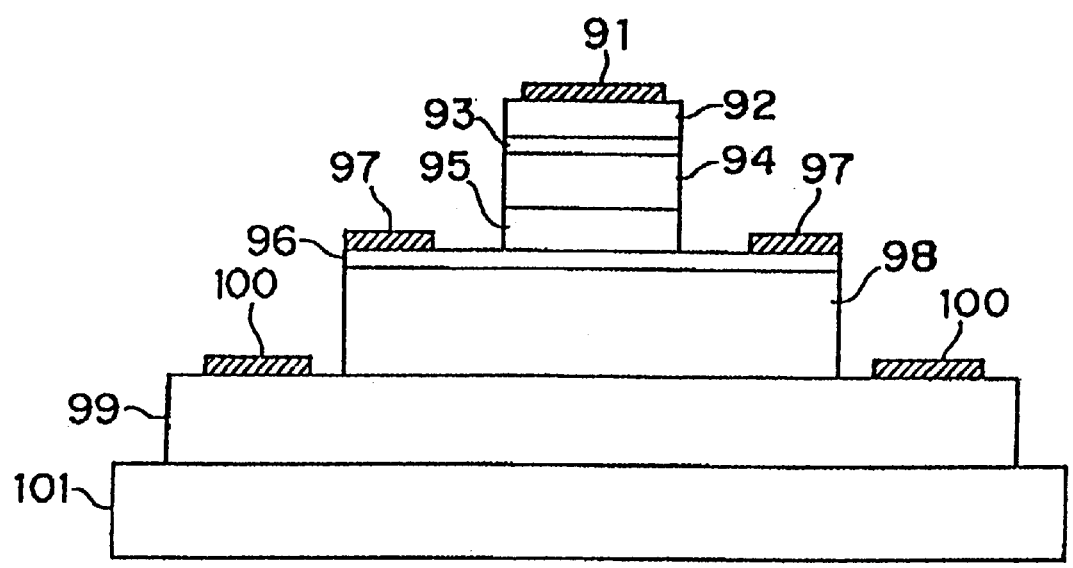
FIG. 6 is a schematic sectional view of another HBT different from those of FIGS. 1 and 5.

FIG. 6 is a schematic sectional view showing the structure of the HBT of the present embodiment. The present embodiment has a construction generally identical to that of the first embodiment except that the emitter layer having the AlGaAs/InGaP structure of the first embodiment is replaced by an InGaP single layer and that the GaAs base layer is replaced by an AlGaAs crystal mixture ratio graded layer.

There are shown an Au/Ge/Ni emitter ohmic electrode 91, an n⁺-type GaAs cap layer 92 (100 nm in thickness, n=5×10¹⁸ cm⁻³) and an n-type $Al_yGa_{1-y}As$ crystal mixture ratio graded cap layer 93 (20 nm in thickness, n=5×10¹⁷ cm⁻³, y=0.35→0.0 (y=0.35 on the substrate side and y=0 on the surface side)). There are further shown an n-type $Al_{0.35}Ga_{0.65}As$ ballast layer 94 (200 nm in thickness, n=5×10¹⁶ cm⁻³), an n-type InGaP emitter layer 95 (50 nm in thickness, n=5×10¹⁷ cm⁻³), and a p⁺-type $Al_xGa_{1-x}As$ crystal mixture ratio graded base layer 96 (80 nm in thickness, p=2×10¹⁹ cm⁻³, C doping, x=0.1→0.0 (x=0 on the substrate side and x=0.1 on the surface side)). There are further shown a Ti/Pt/Au base ohmic electrode 97, an n-type GaAs collector layer 98 (700 nm in thickness, n=2×10¹⁶ cm⁻³), an n⁺-type GaAs sub-collector layer 99 (500 nm in thickness, n=5×10¹⁸ cm⁻³), an Au/Ge/Ni collector ohmic electrode 100 and a semi-insulating GaAs substrate 101.

In general, in order to reduce the base transit time of electron and achieve a high $f_t$ (current gain cut-off frequency) and a high $f_{max}$ (maximum oscillation frequency) in the aforementioned HBT, it is a usual practice to employ the AlGaAs crystal mixture ratio graded layer in place of the GaAs layer as a base layer as in the present embodiment. However, the HBT employing the AlGaAs crystal mixture ratio graded base layer has the drawback that the barrier against the hole in the valence band between the base layer and the emitter layer is reduced. On the contrary, according to the present embodiment, by stacking the emitter layer 95 made of InGaP on the AlGaAs crystal mixture ratio graded base layer 96, the barrier of the hole in the valence band between the base layer and the emitter layer can be raised. Therefore a very effective structure is obtained.

(Fourth Embodiment)

Figure 7:
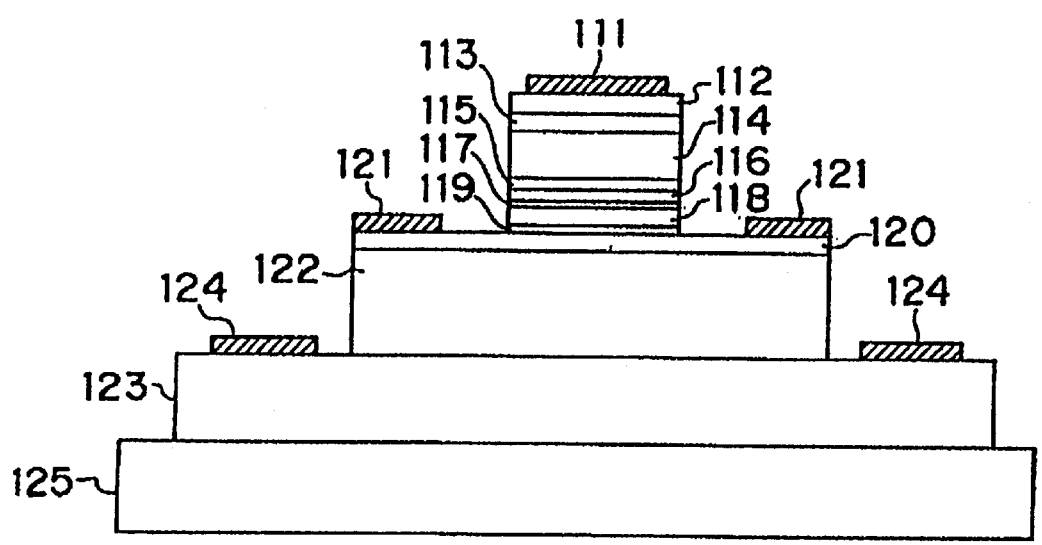
FIG. 7 is a schematic sectional view of another HBT different from those of FIGS. 1, 5 and 6.
Figure 8:
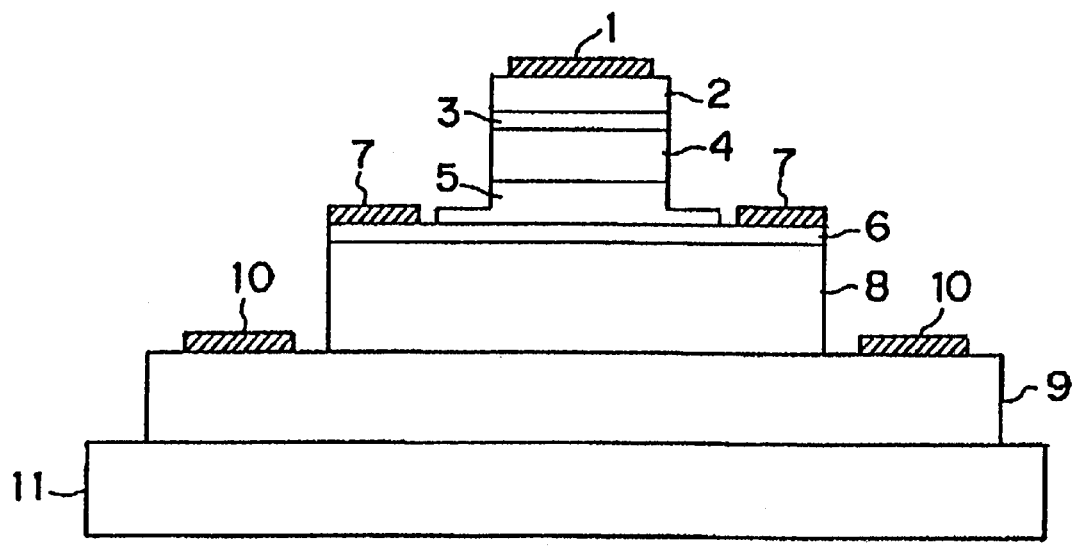
FIG. 8 is a schematic sectional view of the conventional HBT.
Figure 9:
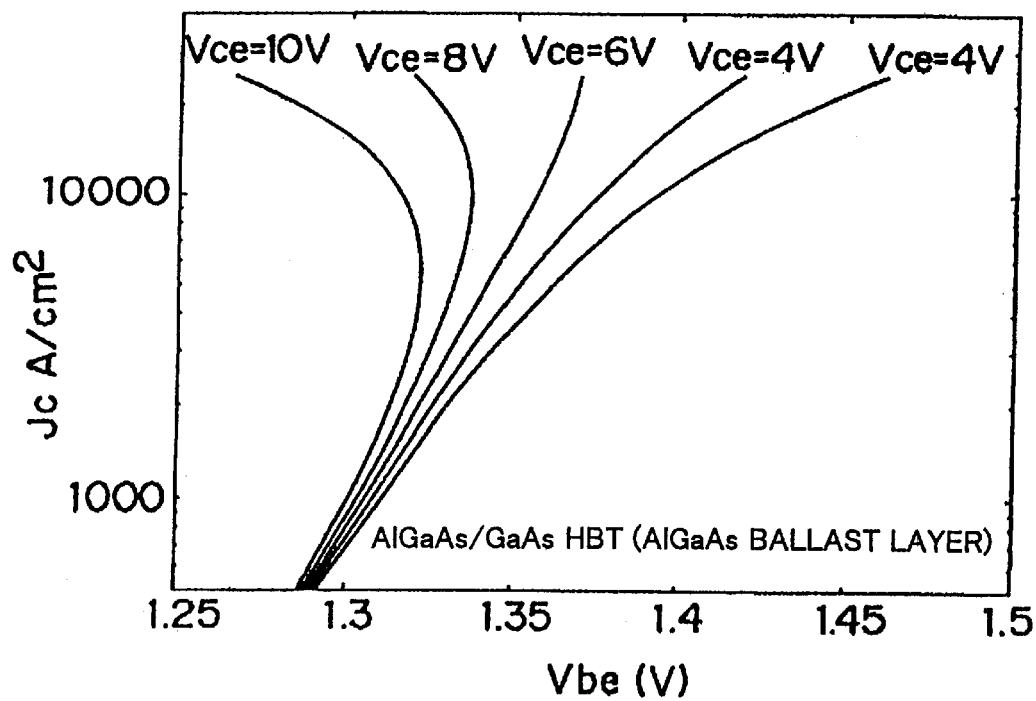
FIG. 9 is a graph showing the Jc-Vbe characteristics of the HBT shown in FIG. 8.
Figure 10:
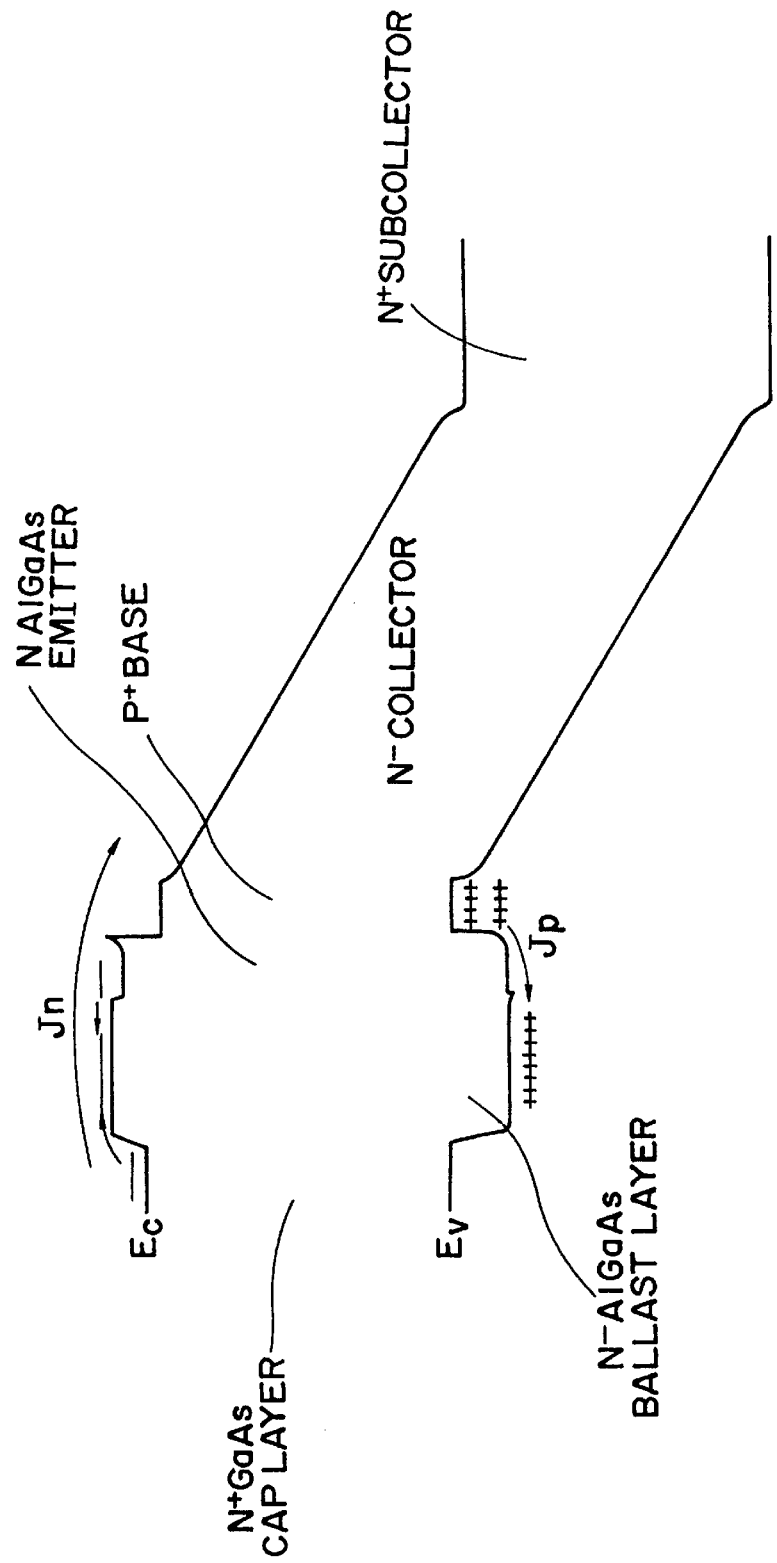
FIG. 10 is a schematic view showing the energy band diagram of the HBT shown in FIG. 8.
Figure 11:
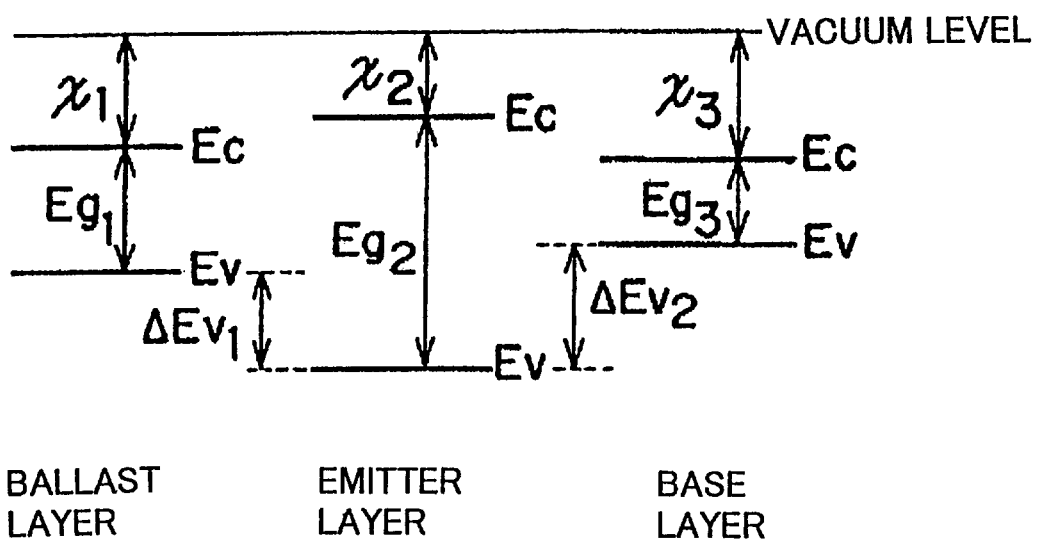
FIG. 11 is a chart showing semiconductor energy levels.

FIG. 7 is a schematic sectional view showing the structure of the HBT of the present embodiment. The present embodiment has a construction generally identical to that of the first embodiment except that the emitter layer having the AlGaAs/InGaP structure of the first embodiment is replaced by an emitter having a stacked structure comprised of an $Al_yGa_{1-y}As$ crystal mixture ratio graded layer, an InGaP layer, an $Al_yGa_{1-y}As$ crystal mixture ratio graded layer, an $Al_{0.3}Ga_{0.7}As$ layer and an $Al_yGa_{1-y}As$ crystal mixture ratio graded layer.

There are shown an Au/Ge/Ni emitter ohmic electrode 111, an n⁺-type GaAs cap layer 112 (100 nm in thickness, n=5×10¹⁸ cm⁻³)and an n-type $Al_yGa_{1-y}As$ crystal mixture ratio graded cap layer 113 (20 nm in thickness, n=5×10¹⁷ cm⁻³, y=0.35→0.0 (y=0.35 on the substrate side and y=0 on the surface side)) and an n-type $Al_{0.35}Ga_{0.65}As$ ballast layer 114 (200 nm in thickness, n=5×10¹⁶ cm⁻³). There are also shown an n-type $Al_yGa_{1-y}As$ crystal mixture ratio graded emitter layer 115 (20 nm in thickness, n=5×10¹⁷ cm⁻³, Si doping, y=0.25→0.3 (y=0.25 on the substrate side and y=0.3 on the surface side)), an n-type InGaP emitter layer 116 (40 nm in thickness, n=5×10¹⁷ cm⁻³, Si doping), an n-type $Al_yGa_{1-y}As$ crystal mixture ratio graded emitter layer 117 (20 nm in thickness, n=5×10¹⁷ cm⁻³, Si doping, y=0.3→0.25 (y=0.3 on the substrate side and y=0.25 on the surface side)), an n-type $Al_{0.3}Ga_{0.7}As$ emitter layer 113 (40 nm in thickness, n=5×10¹⁷ cm⁻³) and an n-type $Al_yGa_{1-y}As$ crystal mixture ratio graded emitter layer 119 (20 nm in thickness, n=5×10¹⁷ cm⁻³, y=0→0.3 (y=0 on the substrate side and y=0.3 on the surface side)). There are further shown a p⁺-type GaAs base layer 120 (80 nm in thickness, p=2×10¹⁹ cm⁻³, C doping), a Ti/Pt/Au base ohmic electrode 121, an n-type GaAs collector layer 122 (700 nm in thickness, n=2×10¹⁶ cm⁻³), an n⁺-type GaAs sub-collector layer 123 (500 nm in thickness, n=5×10¹⁸ cm⁻³), an Au/Ge/Ni collector ohmic electrode 124 and a semi-insulating GaAs substrate 125.

As described above, in the present embodiment, the $Al_yGa_{1-y}As$ crystal mixture ratio graded layers 115 and 117 are employed in the emitter layer. Therefore, the energy barrier of the conduction band at the interfaces between the above layers and the InGaP emitter layer 116 are reduced respectively. Therefore, an emitter layer having low resistance can be obtained.

According to the description of the first through fourth embodiments, InGaP is employed as the material of the emitter layer or at least one layer of the emitter layer. However, similar effects can be obtained by employing InAlP, InGaAlP, InGaAsP, InAlAsP or InGaAlAsP. It is because that the value ΔEv/ΔEg, which is the ratio of the band offset energy ΔEv in the valence band between said each layer and the GaAs base layer 27, 77, 96 or 120 to the band gap energy difference ΔEg between said each layer and the GaAs base layer 27, 77, 96 or 120, is greater than the conventional value of 0.36.

In general, an improvement in characteristics of an HBT can be expected by reducing the emitter width. However, because a multiple unit is constructed with many HBT device units in practice in order to obtain a great output, there is a tendency to cause non-uniformity of temperature between their HBT device units. In addition, in order to increase the current per unit area, the heat generation per unit area is increased raising the temperature, and therefore they tend to cause thermorunaway. For this reason, the expected effect cannot be produced. On the contrary, according to the aforementioned HBT structure of the embodiments, satisfactory uniformity of current and temperature can be obtained by preventing the effect of the n-type AlGaAs ballast layer from being hindered even at a high temperature and a high current density. This allows an improvement in characteristics of the device by reducing the emitter width. As a result, the current efficiency becomes improved, and the consumption of power in obtaining the same output is reduced. This allows the obtainment of a synergistic effect of a reduction in heat generation and a difficulty in causing the thermorunaway. As a result, a high-output device can be provided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heterojunction bipolar transistor having a stack, which comprises:

a base layer;

an emitter layer; and a ballast layer, wherein the emitter layer comprises a plurality of layers, and one layer of the emitter layers that directly contacts the ballast layer comprises InGaP, InAlP, InGaAlP, InAlAsP or InGaAlAsP.

2. The heterojunction bipolar transistor as claimed in claim 1, wherein the emitter layer has a two-layer structure comprising an AlGaAs layer and an InGaP layer.

3. The heterojunction bipolar transistor as claimed in claim 1, wherein the ballast layer is an $Al_xGa_{1-x}As$ layer, where x is in a range of $0<x<0.45$.

4. The heterojunction bipolar transistor as claimed in claim 1, wherein the ballast layer is an $Al_xGa_{1-x}As$ layer, where x is in a range of $0.12<x\leq0.4$.

5. A heterojunction bipolar transistor having a stack, which comprises:

a base layer;

an emitter layer; and a ballast layer, wherein the emitter layer comprises at least three layers, and one layer of the emitter layers that directly contacts neither the ballast layer nor the base layer comprises InGaP, InAlP, InGaAlP, InAlAsP or InGaAlAsP.

6. The heterojunction bipolar transistor as claimed in claim 5, wherein the ballast layer is an $Al_xGa_{1-x}As$ layer, where x is in a range of $0<x<0.45$.

7. The heterojunction bipolar transistor as claimed in claim 5, wherein the ballast layer is an $Al_xGa_{1-x}As$ layer, where x is in a range of $0.12<x\leq0.4$.

8. Heterojunction bipolar transistor having a stack, which comprises:

a base layer;

an emitter layer; and a ballast layer, wherein the emitter layer has a three-layer structure sequentially comprising an AlGaAs layer, an InGaP layer and an AlGaAs layer.

* * * * *